(12) United States Patent
Engelvin et al.

(10) Patent No.: US 9,261,230 B2
(45) Date of Patent: Feb. 16, 2016

(54) CONNECTION SYSTEM FOR CONNECTING AN ELECTRONIC DEVICE, IN PARTICULAR FOR AN AIRCRAFT, TO A TEST UNIT

(71) Applicant: AIRBUS OPERATIONS (S.A.S.), Toulouse (FR)

(72) Inventors: Pierre-Louis Engelvin, Balma (FR); Patrice Lafont, Mons (FR)

(73) Assignee: Airbus Operations (S.A.S.), Toulouse (FR)

( * ) Notice: Subject to any disclaimer, the term of this patent is extended or adjusted under 35 U.S.C. 154(b) by 320 days.

(21) Appl. No.: 14/039,917

(22) Filed: Sep. 27, 2013

(65) Prior Publication Data

US 2014/0091188 A1    Apr. 3, 2014

(30) Foreign Application Priority Data

Oct. 1, 2012  (FR) ...................................... 12 59247

(51) Int. Cl.
 *H01R 13/629* (2006.01)
 *F16M 13/02* (2006.01)
 *H05K 7/14* (2006.01)
 *G01R 31/00* (2006.01)

(52) U.S. Cl.
 CPC ........... *F16M 13/022* (2013.01); *H05K 7/1412* (2013.01); *H05K 7/1454* (2013.01); *G01R 31/008* (2013.01)

(58) Field of Classification Search
 CPC ........... G01R 1/0408; H01R 13/62938; H01R 13/62944; H01R 2201/20
 USPC ................................ 324/756.01; 439/51, 32, 54
 See application file for complete search history.

(56) References Cited

U.S. PATENT DOCUMENTS

| | | | |
|---|---|---|---|
| 5,737,541 A * | 4/1998 | Shimizu | G06F 1/1632 361/679.41 |
| 6,269,319 B1 | 7/2001 | Neisch | |
| 6,350,130 B1 | 2/2002 | Eller | |
| 6,844,718 B2 * | 1/2005 | Heigl | G01R 31/2887 324/756.02 |
| 2002/0137389 A1 | 9/2002 | Hurst | |
| 2005/0041408 A1 | 2/2005 | Burgers | |

FOREIGN PATENT DOCUMENTS

EP  22313-1450  3/2010
WO  WO 97/22886  6/1997

OTHER PUBLICATIONS

French Search Report for Application No. 1259247 dated May 22, 2013.

* cited by examiner

*Primary Examiner* — Jeanette E Chapman
*Assistant Examiner* — Daniel Kenny
(74) *Attorney, Agent, or Firm* — Jenkins, Wilson, Taylor & Hunt, P.A.

(57) ABSTRACT

Connection system for connecting an electronic device, in particular for an aircraft, to a test unit. The connection system includes a fixed portion, which is fixable to said test unit, and a movable plate which is capable of receiving the electronic device to be tested and is displaceable linearly with respect to said fixed portion between two positions which correspond respectively to a connection position and a disconnection position of the electronic device, by manually actuated displacement.

13 Claims, 5 Drawing Sheets

CONNECTION SYSTEM FOR CONNECTING AN ELECTRONIC DEVICE, IN PARTICULAR FOR AN AIRCRAFT, TO A TEST UNIT

TECHNICAL FIELD

The present invention relates to a connection system for connecting an electronic device to be tested, in particular for an aircraft, to a test unit, and also to a test unit provided with such a connection system.

BACKGROUND

Within the context of developing onboard avionics equipment (which meets, in particular, the ARINC 600 standard), it is known to be necessary to systematically conduct functional tests on the equipment during the production process. These functional tests are generally implemented by means of a standard ATEC (or Automatic Test Equipment Complex) test bay. Such bays are very widespread in the field of onboard electronics.

More particularly, the production rates for onboard equipment are increasing greatly as delivery rates for civil and military aircraft increase. This results in maximum operating rates at equipment production lines and, therefore, at the test bays. The testing staff and resources used are thus placed under much pressure. This can all impact on performance, availability and quality.

The direct result of the increase in the electric content of aircraft is the increase in computing power and data-processing requirements. This translates into an increase in the size of electronic devices and in the number of signals to be processed. These signals are carried from the electronic device (computer) to an aircraft system by means of connectors. The connectors used have a very high density of contacts. These contacts (or pins) are very sensitive to poor handling. Thus, it is not uncommon to find damage at these contacts during the production process or even on an aircraft. For these reasons, the number of tests continues to increase.

To conduct a test, the electronic device is connected manually to the test bay, which can cause accidental damage during insertion and removal of the equipment.

Moreover, the conventional connection systems used to this effect are generally adapted to a single computer size, which means that different connection systems have to be provided to be able to test various electronic devices.

SUMMARY

The present invention relates to a connection system for connecting an electronic device to be tested, in particular for an aircraft, to a test unit, the object of which is to overcome the aforesaid drawbacks.

According to the invention, said connection system is distinctive in that it comprises:

a fixed portion, which is can be fixed to said test unit;

a movable plate which is mounted on said fixed portion and is capable of receiving the electronic device to be tested, said movable plate being able to be displaced linearly with respect to said fixed portion in a longitudinal direction and brought into one of the following two positions:

a rear position which corresponds to a position for connecting the electronic device to the test unit; and a forward position which is remote from the test unit and corresponds to a position for disconnecting the electronic device from the test unit, said movable plate being configured such that its displacement from the forward position towards the rear position directly produces the connection and its displacement from the rear position towards the forward position directly produces the disconnection;

manually actuated displacement generation means which are able to displace said movable plate between said rear position and said forward position with a single manual actuation; and width adjustment means which comprise opposite sidewalls for at least laterally supporting the electronic device that is to be arranged between these sidewalls with lateral contact, the spacing of which sidewalls, laterally to the longitudinal direction in which the movable plate is displaced, being adjustable for adaptation to the size of said electronic device.

Thus, owing to the invention, since the connection is produced directly by the displacement of the movable plate from the forward position to the rear position, and vice versa for the disconnection, said connection system allows an electronic device, in particular of ARINC standard, to be connected/disconnected in a single movement, to a test bay or to any other test unit. This connection replaces and improves the conventional manual connection of an electronic device which may cause accidental damage during connection or disconnection. Thus, the invention reduces the risk of damage in particular at these contacts.

In addition, the system according to the invention is self-adapting. Indeed, owing to said width adjustment means, it is adapted to all electronic device sizes, unlike conventional systems. It can be used in particular for any type of avionic electronic device and, in particular, for computers governed by the ARINC 600 standard: 3, 4, 5, 6, 7, 8, 9 MCU (Modular Concept Unit).

In a preferred embodiment, the width adjustment means comprise:

two pairs of sidewalls, each pair comprising two sidewalls which are joined together;

displacement means for laterally displacing said pairs in order to adjust the spacing between these two pairs of sidewalls in order to adapt said spacing to the width of an electronic device; and blocking/unblocking means which are able to block said pair of sidewalls to prevent lateral displacement and to unblock them to permit lateral displacement.

These width adjustment means are simple and robust.

In addition, advantageously, each sidewall pair comprises an external fixed sidewall which is able to be secured to said fixed portion and an internal movable sidewall which is rigidly connected to said movable plate, said movable sidewall is joined to said fixed sidewall (of the same pair) in such a way as to be displaceable with respect to said fixed sidewall in a single direction, specifically said longitudinal direction, and the two movable sidewalls comprise rear supports for the electronic device, allowing the displacement of the electronic device between a connection position and a disconnection position corresponding respectively to the rear and forward positions of the movable plate.

In a particular embodiment, for each pair of sidewalls, the movable sidewall comprises at least one lug, preferably a screw, which is fixed to said movable sidewall and traverses a linear (preferably oblong) opening of the fixed sidewall made in said longitudinal direction in such a way as to allow displacement of the movable sidewall with respect to the fixed sidewall in this longitudinal direction. Preferably a plurality of openings and of cooperating lugs is provided.

Advantageously, each of said openings is substantially equal in length to a connection/disconnection distance which is required for the device, for example in the region of 30 mm, and each lug (or screw, in particular) is arranged in such a way as to be located at one end of the opening in the forward position of the movable plate and at the other end of the opening in the rear position. The length of these openings directly defines the path for inserting/removing the electronic device and therefore makes it possible to visualise the required connection/disconnection length.

Moreover, in a particular embodiment, said system comprises two ventilation plates which are arranged in a horizontal plane, each rigidly connected to a movable sidewall, and which are mounted on the movable plate in such a way as to make an opening between them, the width thereof being adjustable by the lateral displacement of said movable sidewalls. Advantageously, to produce ventilation, said system additionally comprises means for bringing ventilation air below the opening made between the two ventilation plates. Thus, the ventilation required for the reliable operation of the electronic device to be tested is incorporated directly in the connection system.

Moreover, in a particular embodiment, said displacement generation means comprise:

a drive shaft fitted with an actuatable lever which is mounted on said fixed portion and is drivable in rotation when an operator actuates said lever; and two gear trains which are arranged at the ends of the drive shaft and each cooperate with a rack provided on the movable plate in such a way as to cause said movable plate to translate during rotation of the drive shaft.

Furthermore, advantageously, said system comprises two guide columns having a dual function: both to join together two supports—a front and a rear support—of the fixed portion and to provide linear guidance of the movable plate. To bring about this guidance, the movable plate advantageously comprises four ball bushings, which are coaxial in pairs, each pair of coaxial bushings being traversed by one of said guide columns. Said ball bushings allow the movable plate to be guided in translation with precision and ease. This embodiment also allows the risk of jamming to be eliminated.

Moreover, in a particular embodiment, said movable plate comprises an insertion hook on its front face for supporting an electronic device during its insertion, said insertion hook being provided with notches for allowing the passage of locking supports for the electronic device.

Advantageously, said insertion hook is provided with a plurality of notches which are arranged in such a way as to be adapted to a plurality of different electronic devices.

The present invention also relates to a test unit, in particular an ATEC test bay, comprising at least one connection system of the aforesaid type.

BRIEF DESCRIPTION OF THE DRAWINGS

It will be clear how the invention can be carried out from the figures of the accompanying drawings. In these figures, like references denote similar elements.

DETAILED DESCRIPTION

Figure 1:
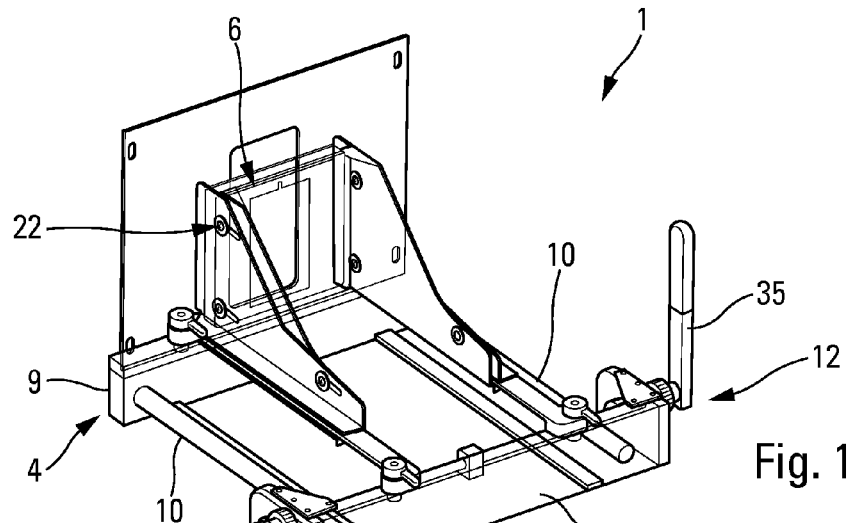
FIG. 1 is a schematic view in perspective of a system according to the invention, without a movable plate.
Figure 2:
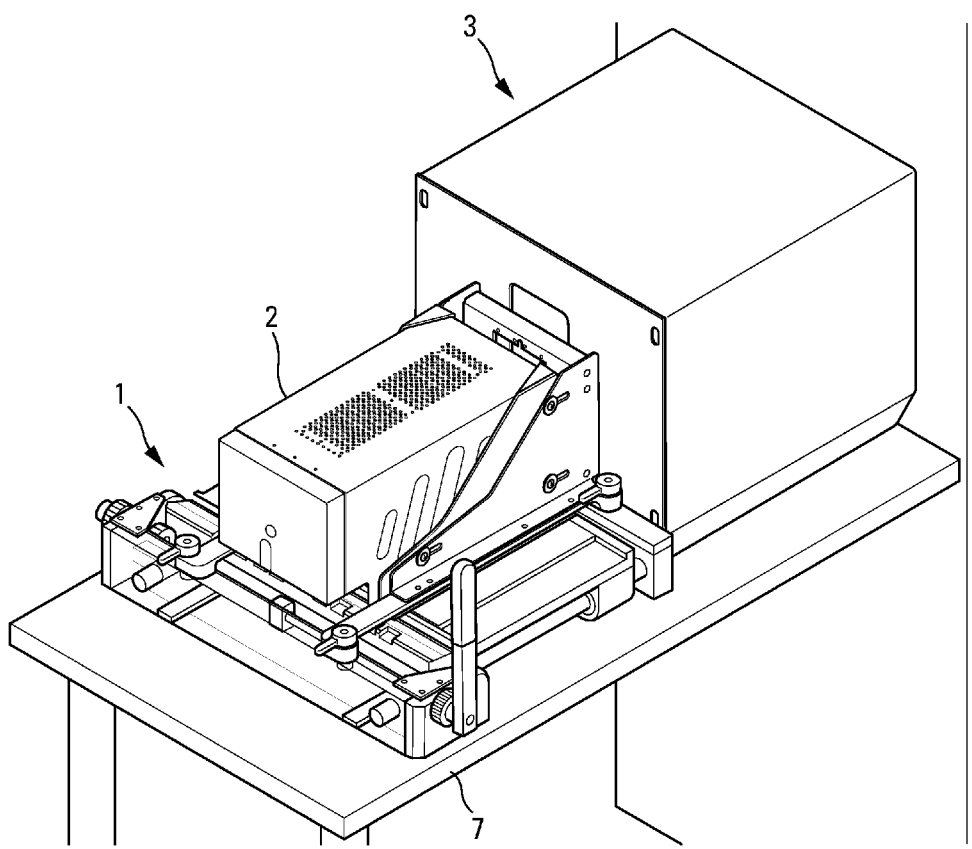
FIG. 2 is a schematic view in perspective of a test unit equipped with a system according to the invention bearing an electronic device to be tested.
Figure 7:
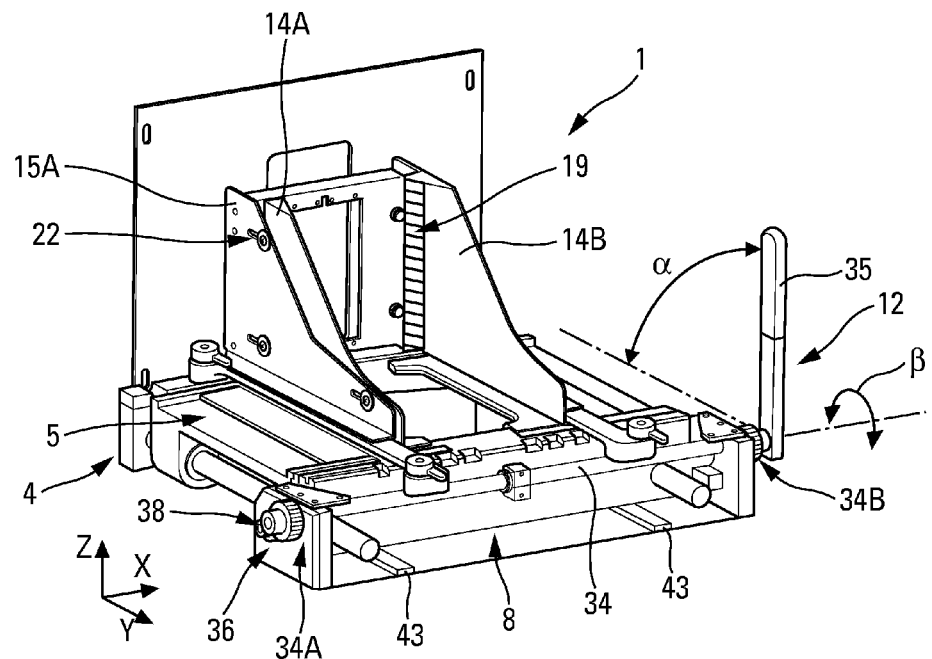
FIG. 7 is similar to FIG. 1 but has a movable plate.

The system 1 in accordance with the invention and shown in particular in FIGS. 1 and 7 is intended to connect an electronic device 2 to be tested, in particular for an aircraft, to a conventional test unit 3, in particular an ATEC test bay, as shown in FIG. 2.

Figure 5:
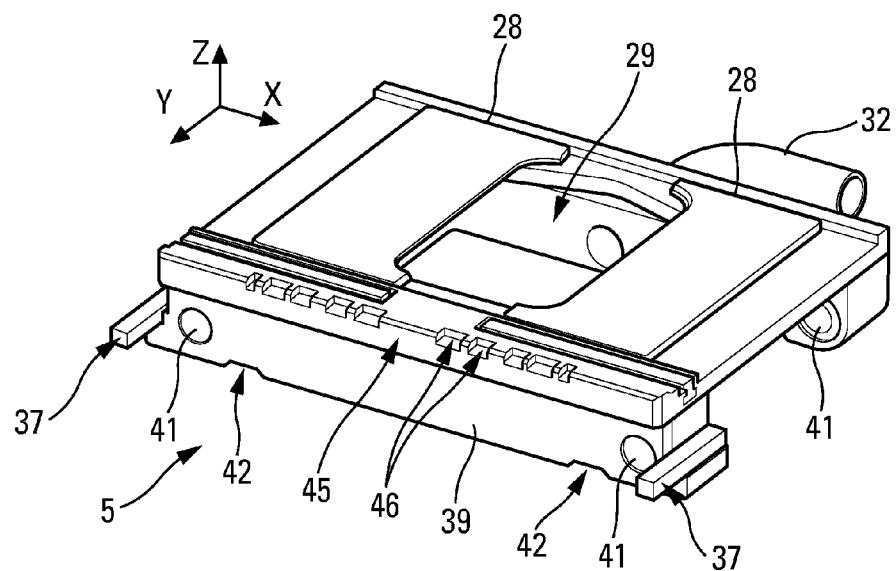
FIG. 5 is a schematic perspective view of a movable plate of a system according to the invention.

According to the invention, said connection system 1 comprises:

a fixed portion 4, which is fixable to said test unit 3; and a movable plate 5, shown in FIG. 5, which is mounted on the fixed portion 4 and is capable of receiving the electronic device 2 to be tested.

Figure 8:
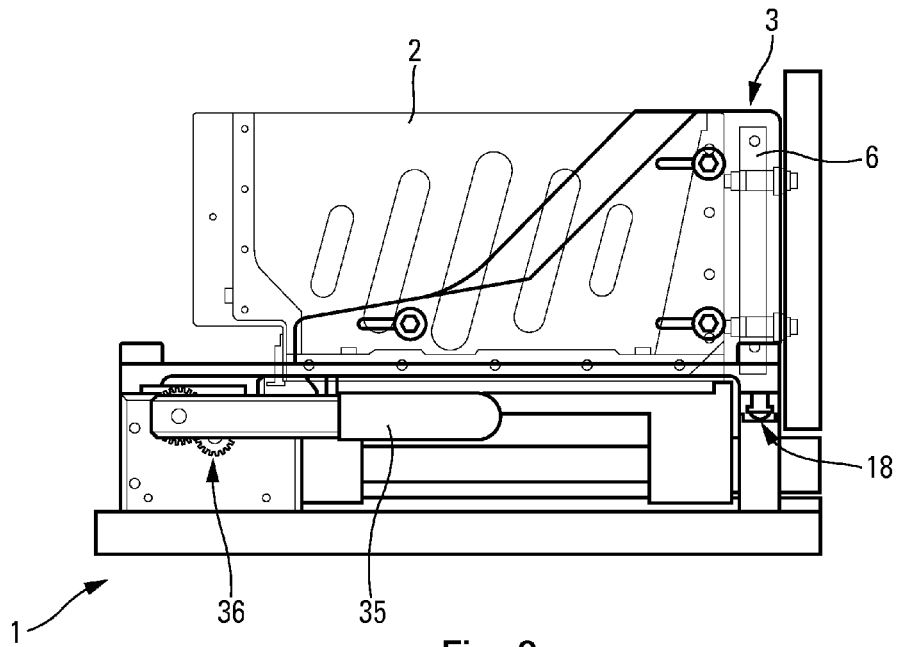
FIGS. 8 and 9 are schematic views of a device mounted on a movable plate of a system according to the invention in a connection position and disconnection position respectively.
Figure 9:
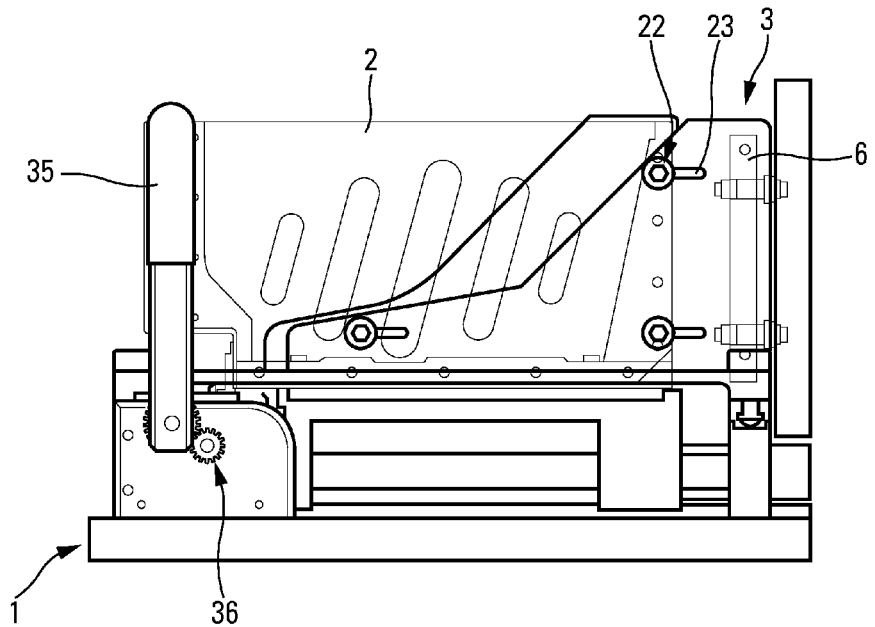

According to the invention, said movable plate 5 is able to be displaced linearly with respect to said fixed portion 4 in a longitudinal direction Y and brought into one of the following two positions:

a rear position which corresponds to a position for connecting the electronic device 2 to the test unit 3 (as shown in FIG. 8); and a forward position which is remote from the test unit 3 and corresponds to a position for disconnecting the electronic device 2 from the test unit 3 (as shown in FIG. 9).

In addition, said movable plate 5 is configured, as set out below, such that:

its displacement from the forward position towards the rear position directly produces the connection of the electronic device 2 by means of the connection of cooperating contacts between the rear face of the electronic device 2 and the front face of the test unit 3; and its displacement from the rear position towards the forward position directly produces the disconnection.

The following description presents the displacements which take place on the system 1 with respect to the mutually orthogonal directions X, Y and Z, of which:

the direction Y, or the longitudinal direction, constitutes the direction in which the electronic device 2 (and also the movable plate 5) is displaced with respect to the test unit 3 during the connection/disconnection;

the direction X, or the lateral direction, is orthogonal to the longitudinal direction Y and forms a horizontal plane XY therewith; and the direction Z, or the vertical direction, is orthogonal to said horizontal plane XY.

The fixed portion 4 of the system 1 is directly attached to the test unit 3, preferably an ATEC test bay. The part 6 of the bay referred to as the "connector holder", to which the fixed portion 4 attached, is shown schematically in FIG. 1, as a light unbroken line. The fixed portion 4 is, for example, joined to this part 6 by means of positioning pins in the direction Z and of screws in the direction X. Once the join is produced (by means of the pins and screws), the fixed portion 4 is positively connected to the test unit 3 in the plane XY and rests on a bench 7 which ensures the support of the fixed portion 4 in the vertical direction Z, as shown in FIG. 2.

The fixed portion 4 comprises two metal supports 8 and 9, preferably made of aluminium, specifically a front support 8 and a rear support 9. For a clearer understanding of the various elements of the system 1, the front support 8 is shown transparently in FIG. 1 and the movable plate is not shown. These two supports 8 and 9 are joined by two columns 10, which are arranged in the direction Y at the two lateral ends. These two joining columns 10 additionally make it possible to ensure that the movable plate 5 is guided in a linear manner along Y with respect to the fixed portion 4, as set out below.

According to the invention, said connection system 1 additionally comprises:

displacement generation means 12, which can be actuated manually by an operator and are able to displace said movable plate 5 between said rear position and said forward position with a single manual actuation; and width adjustment means 13 (FIGS. 3A and 3B) which comprise opposite sidewalls 14A, 14B for at least laterally supporting the electronic device 2 that is to be arranged between said sidewalls with lateral contact. The spacing of said sidewalls, in the direction X, laterally to the longitudinal direction Y in which the movable plate 5 is displaced, can be adjusted for adaptation to the size (width) of the electronic device 2 to be tested.

Thus, since the connection of the electronic device 2 is produced directly by the displacement of the movable plate 5 from the forward position to the rear position, and vice versa for the disconnection, said connection system 1 allows an electronic device 2, in particular of ARINC standard, to be connected/disconnected in a single movement, to a test unit 3. This connection replaces and improves the conventional manual connection of an electronic device which may cause accidental damage during connection or disconnection. Thus, said system 1 reduces the risk of damage in particular at these contacts.

In addition, the system 1 according to the invention is self-adapting. Indeed, owing to said width adjustment means 13 set out below, it can be adapted to all the electronic device sizes, in particular computers governed by the ARINC 600 standard: 3, 4, 5, 6, 7, 8, 9 MCU (Modular Concept Unit).

In a preferred embodiment, the width adjustment means 13 comprise two pairs of sidewalls 16A, 16B. Each pair 16A, 16B comprises two sidewalls, specifically a movable sidewall 14A, 14B and a fixed sidewall 15A, 15B. Said sidewalls 14A, 14B, 15A and 15B each have a planar main portion which is arranged in a vertical plane YZ. The two fixed sidewalls 15A, 15B are rigidly connected to the fixed portion 4. In addition, the two movable sidewalls 14A and 14B are free to translate in the direction Y, as set out below.

Said width adjustment means 13 additionally comprise displacement means 18 comprising, for example, a rail to allow the lateral displacement of said pairs 16A, 16B in order to adjust the spacing between these two pairs of sidewalls for adaptation to the width of the electronic device 2 to be tested. These sidewalls allow the various possible equipment sizes to be accommodated by making them translate by the only degree of freedom permitted by this embodiment, specifically the lateral direction X, as shown by the double-headed arrows F in FIG. 3A.

Figure 3A:
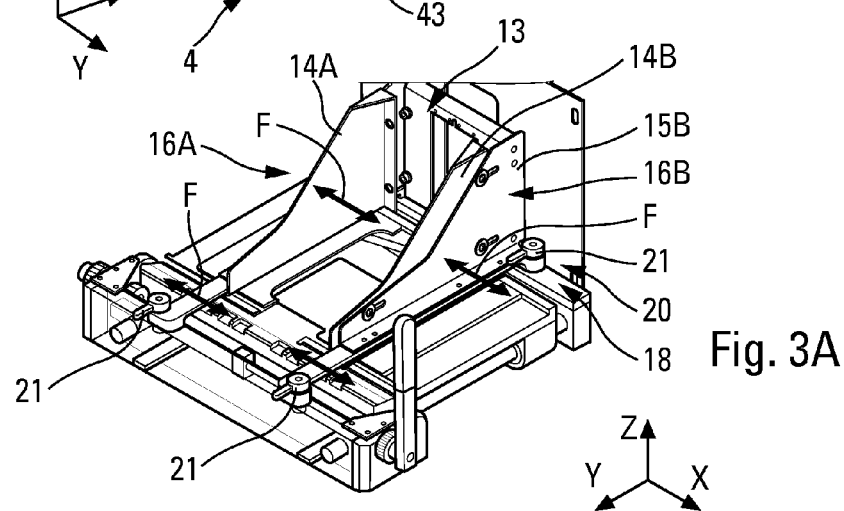
FIGS. 3A and 3B are schematic views in perspective of a system according to the invention equipped with width adjustment means in an unblocking and blocking position respectively.
Figure 3B:
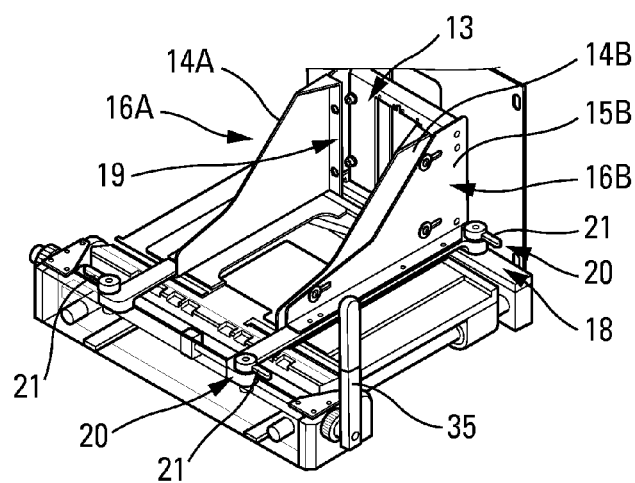

Said width adjustment means 13 additionally comprise blocking/unblocking means 20, produced in the form of catches 21 which are able to block said pair of sidewalls 16A, 16B to prevent lateral displacement, in the position in FIG. 3B, and to unblock them to permit lateral displacement, in the position in FIG. 3A. The positioning catches 21 are arranged at the ends of each of the supports of pairs of sidewalls 16A, 16B in such a way as to allow the supports to be blocked in the position in FIG. 3B in the direction X for insertion and removal, and as to leave them free in the position in FIG. 3A in the direction X to allow them to be adapted to a change in size of the device 2.

These width adjustment means 13 are simple and robust.

Each pair of sidewalls 16A, 16B comprises an external fixed sidewall 15A, 15B which is able to be secured to said fixed portion 4 and an internal movable sidewall 15A, 15B which is rigidly connected to said movable plate 5. In addition, said movable sidewall 14A, 14B is joined to said fixed sidewall 15A, 15B of the same pair in such a way as to be displaceable with respect to said fixed sidewall in the longitudinal direction Y.

In addition, the two movable sidewalls 14A, 14B comprise rear supports 19 (FIG. 7) for the electronic device 2, allowing the displacement of the electronic device 2 between a connection position and a disconnection position corresponding respectively to the rear and forward positions of the movable plate 5.

Figure 6:
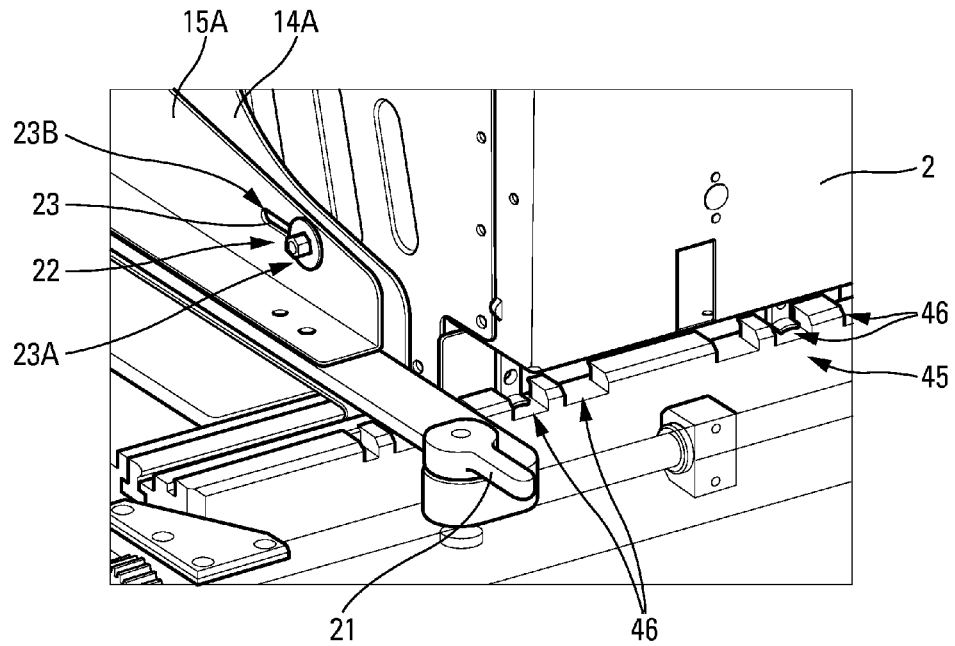
FIG. 6 is a partial schematic view in perspective of a system according to the invention and shows an insertion hook in particular.

In a particular embodiment, for each pair of sidewalls 16A, 16B, the movable sidewall 14A, 14B comprises a plurality of lugs 22, preferably screws, which are fixed to said movable sidewall 14A, 14B and each traverse a linear (preferably oblong) opening 23 of the fixed sidewall 15A, 15B, as can be seen in FIG. 6 in particular. In the embodiment shown in the figures, each movable sidewall 14A, 14B comprises three screws 22.

In addition, each opening 23 is made in the longitudinal direction Y in such a way as to allow displacement of the movable sidewall 14A, 14B with respect to the fixed sidewall 15A, 15B in this longitudinal direction Y.

Furthermore, each of said openings 23 is substantially equal in length (along Y) to a connection/disconnection distance which is required for the device 2, preferably in the region of 30 mm. Each lug 22 is arranged in such a way as to be located at one end 23A of the corresponding opening 23 in the forward position of the movable plate 5 (FIGS. 6 and 7) and at the other end 23B of the opening 23 in the rear position (FIG. 1). The length (along Y) of these openings 23 therefore directly defines the path for inserting/removing the electronic device 2 and makes it possible to visualise the connection/disconnection length required by the device 2.

Figure 4:
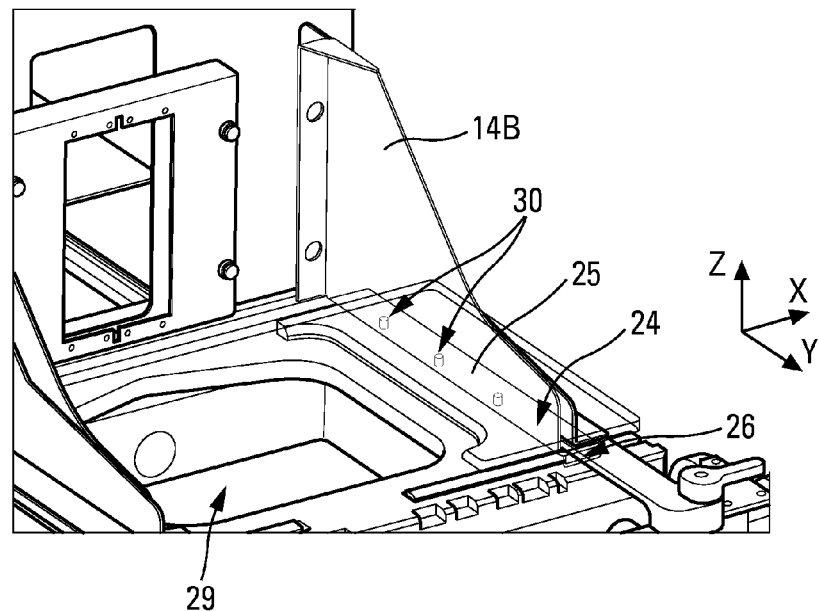
FIG. 4 is a partial schematic view in perspective of a system according to the invention and shows, in particular, a movable sidewall and a ventilation plate.

Moreover, the lower portion 24 of each movable sidewall 14A, 14B is provided with an edge 25 which is arranged in the plane XY and allows a hook 26 to be incorporated in the front portion, as shown in FIG. 4, with a view to allowing the driving of the movable sidewalls 14A, 14B and, therefore, the driving of the electronic device 2.

Moreover, in a particular embodiment, said system 1 comprises two ventilation plates 28 which are arranged in the horizontal plane XY, each rigidly connected to a movable sidewall 14A, 14B, and mounted on the movable plate 5 in such a way as to make an opening 29 between them, the width (along X) thereof being adjustable by the lateral displacement (along X) of said movable sidewalls 14A, 14B.

These two ventilation plates 28 can therefore be guided in translation in the lateral direction X in the plane XY. This makes it possible to adjust the ventilation zone (opening 29) on the basis of the device 2 to be tested, by displacing the two ventilation plates in opposite directions. These two ventilation plates 28 are joined respectively to the two movable sidewalls 14A, 14B by means of fixing screws 30, which are shown schematically in FIG. 4.

To produce ventilation, said system 1 additionally comprises means for bringing air below the opening 29 made between the two ventilation plates 28, as is shown in part by a portion of tube 32 in FIG. 5, which is joined to a conventional ventilation source (not shown) and is able to supply air to the device 2 during a test. Thus, a ventilation system required for the reliable operation of the electronic device 2 to be tested is incorporated directly in the system 1 according to the invention.

Moreover, in a particular embodiment, said displacement generation means 12 comprise:

a drive shaft 34 fitted with an actuatable lever 35 which is mounted on the fixed portion 4 and is drivable in rotation when an operator actuates said lever 35; and two gear trains 36 which are arranged at the ends 34A, 34B of the drive shaft 34 and each cooperate with a rack 37 provided on the movable plate 5 (FIG. 5) in such a way as to cause said movable plate to translate in the direction Y during rotation of the drive shaft 34. The two racks 37 are mounted on either side of a bearing 39 of the movable plate 5.

The drive shaft 34 is mounted on the front support 8 of the fixed portion 4 and is oriented in the direction X. The assembly formed by the lever 35 and the drive shaft 34 allows two drive mechanisms 38, at the two ends 34A, 34B of the shaft 34, to be rotated. Each of these mechanisms 38 is therefore composed of a gear train 36 which allows the movable plate 5 to translate in the direction Y by cooperating with a rack 37.

Furthermore, said system 1 comprises two guide columns 10 which have a dual function: both to join together the two supports—a front and a rear support 8 and 9—of the fixed portion 4 and to provide linear guidance of the movable plate 5.

The joining in translation between the movable plate 5 and the fixed portion 4 is provided by ball bushings 41. To produce this guidance, the movable plate 5 advantageously comprises four ball bushings 41, which are coaxial in pairs, as is shown in FIG. 5. Each pair of coaxial bushings is traversed by one of said guide columns 10, which are arranged in the direction Y. These ball bushings 41 allow the movable plate 5 to be guided in translation with both precision and ease. This embodiment also allows the risk of jamming to be eliminated.

The movable plate 5 also rests, by means of notches 42, on slides 43 to facilitate the displacement in the longitudinal direction Y.

Moreover, in a particular embodiment, said movable plate 5 comprises, on its front face, an insertion hook 45 for supporting an electronic device 2 during its insertion, as is shown in FIG. 6.

This insertion hook 45 is provided with notches 46 for allowing the passage of locking supports for the electronic device 2. By resting on the front face of the device 2, said insertion hook 45 allows this device 2 to be connected.

Furthermore, said insertion hook 45 is provided with a plurality of notches 46 which are made at positions selected in such a way as to suit a plurality of different electronic devices 2. A system 1 is thus obtained which is unique for all the considered equipment sizes, by providing a specific number of notches 46 which are placed judiciously on the insertion hook 45.

By means of the insertion hook 45 in the front portion, the movable plate 5 allows the electronic device 2 to be driven in translation in the direction Y, in order to allow said electronic device 2 to be connected to the test unit 3.

Therefore, to insert an electronic device 2, the spacing of the sidewalls 14A, 14B is adapted to the width of the device 2, and said electronic device is placed on the movable plate 5, which is located in a forward position. When an operator actuates the lever 35 in rotation about the axis X, as shown by an angle α in FIG. 7, this rotates the shaft 34 (as shown by an angle β), which acts on the gear trains 36. The gear trains 36 then drive the racks 37 on the movable plate 5 in translation and, in response, the movable plate 5 moves in the direction Y.

The movable plate 5 drives the device 2 in translation along Y to produce the connection or disconnection. Preferably, the displacement generation means 12 are formed such that the actuation of the lever 35 by an angle of 90° about the direction X generates the entire path of the movable plate 5, in one or the other direction (on the basis of the actuation direction of said lever 35).

The movable plate 5 drives the movable sidewalls 14A and 14B. The device 2 comes to rest, via its rear face, on the planar edge 19 (shown by means of hatching in FIG. 7) of each movable sidewall 14A and 14B. The translation along Y of the movable sidewalls 14A and 14B in the direction of a separation from the test unit 3 thus allows the device 2 to be displaced (bringing about the disconnection) and removed, preventing said device from having to be lifted out, which in particular prevents damage to the various electrical contacts.

FIGS. 8 and 9 show schematically a connection position and a disconnection position respectively and, as a light line, both the device 2 and a part 6 of the test unit 3.

The invention claimed is:

1. Connection system for connecting an electronic device to be tested, in particular for an aircraft, to a test unit, the connection system comprising:

a fixed portion, which is fixable to said test unit;

a movable plate which is mounted on said fixed portion and is capable of receiving the electronic device to be tested, said movable plate being able to be displaced linearly with respect to said fixed portion in a longitudinal direction and to be brought into one of the following two positions:

a rear position which corresponds to a position for connecting the electronic device to the test unit; and a forward position which is remote from the test unit and corresponds to a position for disconnecting the electronic device from the test unit, said movable plate being configured such that its displacement from the forward position towards the rear position directly produces the connection and its displacement from the rear position towards the forward position directly produces the disconnection;

manually actuated displacement generation means which are able to displace said movable plate between said rear position and said forward position with a single manual actuation; and width adjustment means which comprise opposite sidewalls for at least laterally supporting the electronic device that is to be arranged between these sidewalls with lateral contact, the lateral spacing of said opposite sidewalls, laterally to the longitudinal direction in which the movable plate is displaced, being adjustable for adaptation to the size of said electronic device.

2. System according to claim 1, wherein said width adjustment means comprise:

two pairs of sidewalls, each pair comprising two sidewalls which are joined together;

displacement means for laterally displacing said pairs in order to adjust the spacing between these two pair of sidewalls for adaptation to the width of an electronic device; and blocking/unblocking means which are able to block said pairs of sidewalls to prevent lateral displacement and to unblock them to permit lateral displacement.

3. System according to claim 2, wherein each sidewall pair comprises an external fixed sidewall which is able to be secured to said fixed portion and an internal movable sidewall which is rigidly connected to said movable plate, the movable sidewall is joined to said fixed sidewall of the same pair in such a way as to be displaceable with respect to said fixed sidewall in a single direction, specifically said longitudinal direction, and the two movable sidewalls comprise rear supports for the electronic device, allowing the displacement of the electronic device between a connection position and a disconnection position corresponding respectively to the rear and forward positions of the movable plate.

4. System according to claim 3, wherein, for each pair of sidewalls, the movable sidewall comprises at least one lug which is fixed to said movable sidewall and traverses a linear opening of the fixed sidewall, made in said longitudinal direction in such a way as to allow displacement of the movable sidewall with respect to the fixed sidewall in this longitudinal direction.

5. System according to claim 4, wherein each of said openings is substantially equal in length to a connection/disconnection distance which is required for the electronic device, and each lug is arranged in such a way as to be located at one end of the opening in the forward position of the movable plate and at the other end of the opening in the rear position of said movable plate.

6. System according to claim 2, comprising two ventilation plates which are arranged in a horizontal plane, each rigidly connected to a movable sidewall, and mounted on the movable plate in such a way as to make an opening between them, the width thereof being adjustable by the lateral displacement of said movable sidewalls.

7. System according to claim 6, additionally comprising means for bringing ventilation air below the opening made between the two ventilation plates.

8. System according to claim 1, wherein said displacement generation means comprise:
   a drive shaft fitted with an actuatable lever which is mounted on said fixed portion and is drivable in rotation when an operator actuates said lever; and
   two gear trains which are arranged at the ends of the drive shaft and each cooperate with a rack provided on the movable plate in such a way as to cause said movable plate to translate during rotation of the drive shaft.

9. System according to claim 1, comprising two guide columns making it possible both to join together two supports—a front and a rear support—of the fixed portion and to provide linear guidance of the movable plate.

10. System according to claim 9, wherein said movable plate comprises four ball bushings, which are coaxial in pairs, each pair of coaxial bushings being traversed by one of said guide columns.

11. System according to claim 1, wherein said movable plate comprises, on its front face, at least one insertion hook for supporting an electronic device during its insertion, and said insertion hook is provided with notches for allowing the passage of locking supports for the electronic device.

12. System according to claim 11, wherein said insertion hook is provided with a plurality of notches which are arranged in such a way as to be adapted to a plurality of different electronic devices.

13. Test unit, in particular a test bay, comprising at least one connection system according to claim 1.

\* \* \* \* \*